United States Patent
Border et al.

(10) Patent No.: US 6,683,547 B2
(45) Date of Patent: Jan. 27, 2004

(54) METHOD AND SYSTEM FOR DATA COMPESSION WITH DICTIONARY PRE-LOAD OF A SET OF EXPECTED CHARACTER STRINGS

(75) Inventors: John Border, Poolesville, MD (US); Matthew Butehorn, Mt. Airy, MD (US); Robert Jeff Heath, San Diego, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 10/127,643

(22) Filed: Apr. 22, 2002

(65) Prior Publication Data

US 2003/0197630 A1 Oct. 23, 2003

(51) Int. Cl.[7] ................................................. H03M 7/00
(52) U.S. Cl. .......................... 341/106; 341/79; 341/59; 341/67; 704/200
(58) Field of Search ............................... 341/79, 51, 50, 341/67, 59, 106; 704/200

(56) References Cited

U.S. PATENT DOCUMENTS

| | | | | |
|---|---|---|---|---|
| 4,876,541 A | * | 10/1989 | Storer | 341/106 |
| 5,151,697 A | * | 9/1992 | Bunton | 341/51 |
| 5,153,591 A | * | 10/1992 | Clark | 341/79 |
| 5,253,325 A | * | 10/1993 | Clark | 704/200 |
| 5,270,712 A | * | 12/1993 | Iyer et al. | 341/67 |
| 5,375,204 A | * | 12/1994 | Motoyama et al. | 341/51 |
| 5,379,036 A | * | 1/1995 | Storer | 341/51 |
| 5,534,861 A | * | 7/1996 | Chang et al. | 341/79 |
| 6,359,548 B1 | * | 3/2002 | Cooper | 341/106 |
| 6,392,568 B1 | * | 5/2002 | Cooper | 341/106 |

* cited by examiner

*Primary Examiner*—Michael Tokar
*Assistant Examiner*—Lam Mai
(74) *Attorney, Agent, or Firm*—John T. Whelan; Michael Sales

(57) ABSTRACT

A method, apparatus and computer program product for encoding data transmitted over a communications channel, including pre-loading an encoder dictionary with a set of character strings expected to appear in input data to be encoded; and encoding the input data with the set of expected character strings pre-loaded in the encoder dictionary. In another aspect, there is provided a method, apparatus and computer program product for decoding encoded data received over a communications channel, including pre-loading a decoder dictionary with a set of character strings expected to appear in the encoded data; and decoding the encoded data with the set of expected character strings pre-loaded in the decoder dictionary.

34 Claims, 4 Drawing Sheets

METHOD AND SYSTEM FOR DATA COMPRESSION WITH DICTIONARY PRE-LOAD OF A SET OF EXPECTED CHARACTER STRINGS

BACKGROUND OF THE INVENTION

1. Field of the Invention

The present invention generally relates to data compression and more particularly to a method and system for data compression with dictionary pre-load of a set of character strings that can be expected to appear only once or a few times in an input data stream.

2. Discussion of the Background

In recent years, various compression algorithms have been developed. For example, the DEFLATE compression algorithm operates in the IP Payload Compression Protocol (IPComp) application. The DEFLATE algorithm improves upon the Lempel-Ziv 1977 (LZ77) compression algorithm by providing a second compression step that takes the compressed output of LZ77 algorithm and further compresses it using either fixed or dynamic Huffman coding.

Similarly, the Lempel-Ziv-Jeff-Heath (LZJH) data compression algorithm has been developed (e.g., as further described in commonly owned U.S. Pat. Nos. 5,955,976; 5,973,630 and 6,292,115 to Heath incorporated by reference herein) and includes improvements in the data compression via minimum redundancy coding, such as fixed Huffman coding, dynamic Huffman coding, etc. (e.g. as further described in commonly owned U.S. patent application Ser. No. 10/054,219 of Heath (Dock. Nos. 10792-1052/PD-201167), entitled "METHOD, SYSTEM AND COMPUTER PROGRAM PRODUCT FOR LZJH DATA COMPESSION WITH MINIMUM REDUNDANCY CODING," filed on Nov. 9, 2001 incorporated by reference herein.).

However, although the DEFLATE and the LZJH algorithms, being adaptive, represent a redundant character string by a compressed code after encountering the character string within an input data stream at least twice, such algorithms do not take advantage of character strings that can be expected to appear only once or a few times per input data stream.

Therefore, there is a need for a method and system for improving data compression with respect to character strings that can be expected to appear only once or a few times per input data stream.

SUMMARY OF THE INVENTION

The above and other needs are addressed by the present invention, which provides an improved method and system for data compression with dictionary pre-load of a set of character strings that can be expected to appear only once or a few times per input data stream. Advantageously, data compression can be improved by pre-loading encoder and decoder compression dictionaries with a set of expected character strings that can, depending upon a specific application, be expected to appear in data to be compressed.

Accordingly, in one aspect of the present invention, there is provided an improved method, apparatus and computer program product for encoding data transmitted over a communications channel, including pre-loading an encoder dictionary with a set of character strings expected to appear in input data to be encoded; and encoding the input data with the set of expected character strings pre-loaded in the encoder dictionary.

In another aspect of the present invention, there is provided an improved method, apparatus and computer program product for decoding encoded data received over a communications channel, including pre-loading a decoder dictionary with a set of character strings expected to appear in the encoded data; and decoding the encoded data with the set of expected character strings pre-loaded in the decoder dictionary.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

A method and system for data compression with dictionary pre-load of a set of expected character strings are described. In the following description, for purposes of explanation, numerous specific details are set forth in order to provide a thorough understanding of the present invention. It is apparent to one skilled in the art, however, that the present invention can be practiced without these specific details or with an equivalent arrangement. In some instances, well-known structures and devices are shown in block diagram form in order to avoid unnecessarily obscuring the present invention.

Figure 1:
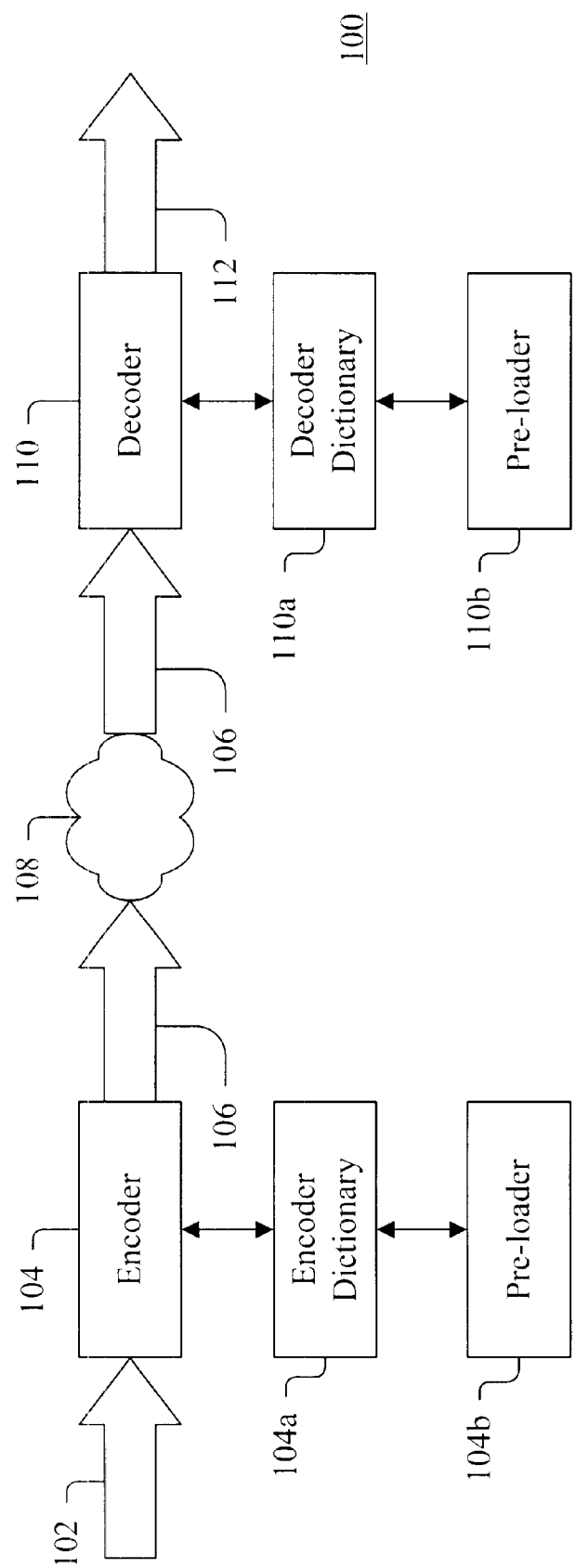
FIG. 1 is a system diagram illustrating an exemplary system, which can employ data compression with dictionary pre-load of a set of expected character strings, according to the present invention.

Referring now to the drawings, wherein like reference numerals designate identical or corresponding parts throughout the several views, and more particularly to FIG. 1 thereof, there is illustrated a system 100 for implementing data compression with dictionary pre-load of a set of expected character strings, according to the present invention. In FIG. 1, the system 100 (e.g., as further described in commonly owned U.S. Pat. Nos. 5,955,976; 5,973,630 and 6,292,115 to Heath, incorporated by reference herein) includes an encoder 104 (e.g., implemented via hardware and/or software) and encoder dictionary 104a (e.g., implemented via hardware and/or software) coupled via a communications channel 108 to a decoder 110 (e.g., implemented via hardware and/or software) and decoder dictionary 110a (e.g., implemented via hardware and/or software). The system 100 further includes pre-loaders 104b and 110*b* (e.g., implemented via hardware and/or software) for pre-loading the sets of the expected character strings into the encoder and decoder dictionaries 104*a* and 110*a*, respectively.

The system 100 includes any suitable servers, workstations, personal computers (PCs), personal digital assistants (PDAs), Internet appliances, set top boxes, other devices, etc., capable of performing the processes of the present invention. The encoder 104 and the decoder 110 of the system 100 can communicate with each other using any suitable protocol, for example, via the communications channel 108 and the system 100 can be implemented using one or more of the computer system 301 of FIG. 3, for example. One or more interface mechanisms can be used in the system 100, for example, including Internet access, telecommunications in any form (e.g., voice, modem, etc.), wireless communications media, etc., via the communications channel 108. Accordingly, the communications channel 108 can include, for example, the Internet, an Intranet, a wireless communications channel, a satellite communications channel, a cellular communications channel, a hybrid communications channel, etc.

It is to be understood that the system in FIG. 1 is for exemplary purposes only, as many variations of the specific hardware used to implement the present invention are possible, as will be appreciated by those skilled in the relevant art(s). For example, the functionality of the encoder 104, the decoder 110*b*, the pre-loader 104*b*, and the pre-loader 110*b* of the system 100 can be implemented via one or more programmed computers or devices. To implement such variations as well as other variations, a single computer (e.g., the computer system 301 of FIG. 3) can be programmed to perform the special purpose functions of, for example, the encoder 104 and the pre-loader 104*b* or the decoder 110 and the pre-loader 110*b* shown in FIG. 1. On the other hand, two or more programmed computers or devices, for example as in shown FIG. 3, can be substituted for any one of the encoder 104, the decoder 110*m*, the pre-loader 104*b*, and the pre-loader 110*b*. Principles and advantages of distributed processing, such as redundancy, replication, etc., can also be implemented as desired to increase the robustness and performance of the system 100, for example.

The communications channel 108 can be implemented via one or more communications channels (e.g., the Internet, an Intranet, a wireless communications channel, a satellite communications channel, a cellular communications channel, a hybrid communications channel, etc.), as will be appreciated by those skilled in the relevant art(s). In a preferred embodiment of the present invention, the communications channel 108 preferably uses electrical, electromagnetic, optical signals, etc., that carry digital data streams, as are further described with respect to FIG. 3.

An adaptive data compression/decompression algorithm (e.g., the LZJH algorithm as described, for example, in U.S. patent application Ser. No. 10/054,219 of Heath, Dock. Nos. 10792-1052/PD-201167, entitled "METHOD, SYSTEM AND COMPUTER PROGRAM PRODUCT FOR LZJH DATA COMPESSION WITH MINIMUM REDUNDANCY CODING," filed on Nov. 2001 and/or U.S. Pat. Nos. 5,955, 976; 5,973,630 and 6,292,115 to Heath, the disclosure of all of which are incorporated by reference herein) can be employed in the encoder 104 and the decoder 110. Such a data compression algorithm, being adaptive, can represent a redundant character string (e.g., a character string appearing at least twice within the input data stream 102) by a compressed code that can be transmitted as compressed data 106 over communications channel 108 to the decoder 110.

Since the algorithm included in the encoder 104 is adaptive, an initial state of the encoder dictionary 104*a* of character strings previously encountered by the encoder 104 may be empty. As the encoder 104 process the input data 102, the encoder 104 builds the encoder dictionary 104*a* of character strings as they are received. To encode a redundant character string with a compressed code, the character string is included in the encoder dictionary 104*a*.

As noted above, the algorithm included in the encoder 104 can adapt to and build a dictionary of character strings that are stored in the encoder dictionary 104*a* based upon the data 102 being received. For example, the first time a character string in the data 102 is processed by the encoder 104, a previously seen duplicate of the string is not necessarily included in the encoder dictionary 104*a* (e.g., if the duplicate of the string occurs in a subsequently received data stream) and the encoder 104 can end up having to transfer the character strings themselves (i.e., rather than an encoded representation thereof) to the decoder 110, which may not result in positive compression.

As an example, the following data 102 (e.g., from a registration form, etc.) includes certain character strings (e.g., "Name:", "Address:", "City:", "State:", "Zip Code:", "Phone Number:", "Occupation:", etc.) that are known ahead of time to appear in the data 102, but that only appear once in the data 102:

Name: John Doe
Address: 1234 Elm Street
City: Peoria
State: Illinois
Zip Code: 56789
Phone Number: 413-517-4321
Occupation: Plumber There is very little redundancy in the above data 102 and compression of such data 102 can result in very little positive compression using other compression techniques. This situation is exasperated in a computer system that employs such compression/decompression and that processes numerous data blocks including such form data 102 filled in with information from different individuals and compresses each block for transferring over the communications channel 108. The present invention solves such problems by pre-loading, via the pre-loaders 104*b* and 110*b*, the encoder dictionary 104*a* and the decoder dictionary 110*a* with a set of expected character strings (e.g., "Name:", "Address:", "City:", "State:", "Zip Code:", "Phone Number:", "Occupation:", etc.) that are known ahead of time to appear in the data 102, but that may only appear once in a given block of the data 102.

Figure 2A:
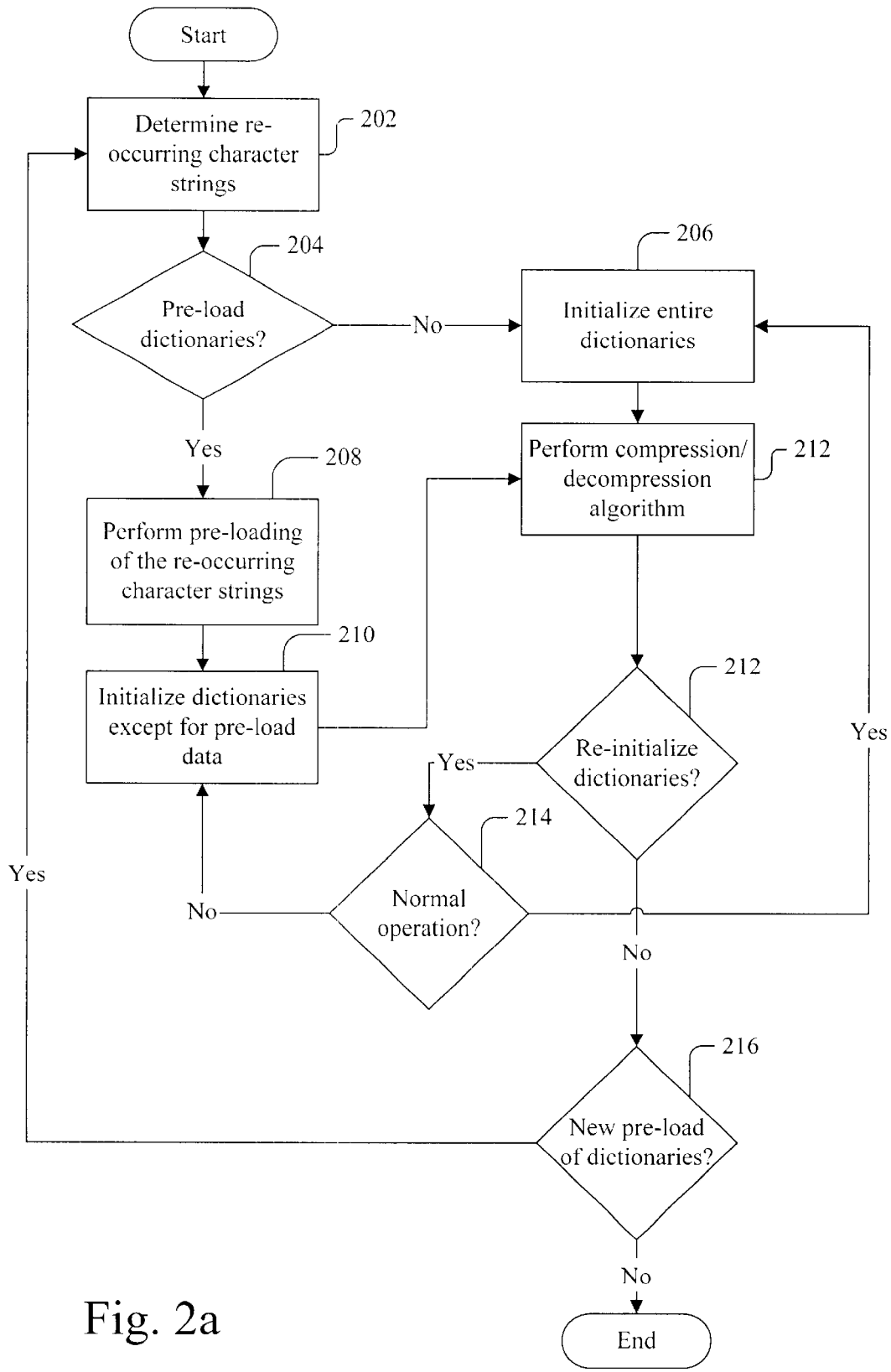
FIGS. 2a and 2b are a flow chart for illustrating data compression with dictionary pre-load of a set of expected character strings, according to the present invention.

FIG. 2*a* is a flow chart for illustrating data compression with dictionary pre-load of a set of expected character strings, according to the present invention. In FIG. 2*a*, if it is known ahead of time (e.g., by a higher layer application, etc.) that certain character strings (e.g., "Name:", "Address:", "City:", "State:", "Zip Code:", "Phone Number:", "Occupation:", etc.) are expected to be contained in the data 102 as determined by step 202, then such character strings can be pre-loaded, via the pre-loaders 104*b* and 110*b*, into the encoder dictionary 104*a* and the decoder dictionary 110*a* at step 208 as determined by step 204, advantageously, resulting in improved compression ratios. Compression/decompression then can be performed by the encoder 104 and the decoder 110 at step 212 using the dictionaries 104*a* and 110*a* pre-loaded at step 206 after initialization of the encoder dictionary 104*a* and the decoder dictionary 10*a* at steps 206 or 210.

According to the present invention, the encoder dictionary 104a and the decoder dictionary 110a can be pre-loaded at step 208 with any set of character strings (e.g., "Name:", "Address:", "City:", "State:", "Zip Code:", "Phone Number:", "Occupation:", etc., in the case of data 102 from a registration form) that can be expected to appear one or more times in the received data 102. The compression improvement in the registration form example can be impressive, ignoring for the moment any unique information filled in for each individual that can be compressed, wherein pre-loading of the encoder dictionary 104a and the decoder dictionary 110a with the set of expected registration form character strings at step 208 may result in almost a 9 to 1 compression efficiency at step 212.

As will be appreciated by those skilled in the relevant art(s), the present invention is not limited to sets of the data 102 which all have the same expected character strings. For example, the expected character strings can be pre-loaded into the encoder dictionary 104a and the decoder dictionary 110a because the expected character strings typically appear in the data 102, even though the expected character strings do not always appear in the data 102.

In addition, the expected character strings can be pre-loaded into the encoder dictionary 104a and the decoder dictionary 110a because one of a small set of character strings typically appears in the data 102. For example, the present invention can improve performance for web browsing by compressing the HyperText Transfer Protocol (HTTP) headers used to retrieve objects associated with Internet and Intranet web pages.

Specifically, the HTTP uses ASCII character strings in its headers and many of the character strings that are used are common to many HTTP transactions. Examples of two of such common character strings are the HTTP version and the type of browser being used. For example, HTTP version strings, such as "HTTP Version: 1.0," HTTP Version: 1.1, "etc., may occur in almost every HTTP request and response.

Similarly, several web browsers most commonly in use for web browsing are based on software developed by the Mozilla project. These browsers may insert a common browser type string (e.g., "Browser Type: Mozilla," etc.) into their HTTP requests. However, for both the HTTP version and the browser type, the expected character strings may only show up in a message once. Accordingly, by pre-loading such expected character strings into the encoder dictionary 104a and the decoder dictionary 110a, the present invention allows such character strings to be compressed when they are present in the data 102. By contrast, this may not be possible with other compression techniques.

The expected character strings that can be pre-loaded according to the present invention are not limited to character strings that are specific to the use of the HTTP, as will be appreciated by those skilled in the relevant art(s). For example, in the case of Internet and/or Intranet web pages, additional strings may be common for many or all of such web pages. As an example, every object on every web page at a company's web site may include a common string (e.g., "URL:/www.company.com/intranet/") that may appear in the data 202, but only once. The following examples illustrate several potential requests, which can be compressed with the following expected character strings being pre-loaded into the encoder dictionary 104a and the decoder dictionary 110a:

HTTP Version: 1.0
Browser Type: Mozilla
URL:/www.company.com/intranet/company.news
HTTP Version: 1.1
Browser Type: Mozilla
URL:/www.company.com/intranet/engineering/org.charts
HTTP Version: 1.0
Browser Type: Mozilla
URL:/www.irs.gov There is very little redundancy in the above examples of data 102 and compression of such data 102 may result in very little positive compression using other compression techniques. In a computer system employing such compression/decompression, the computer system expends resources (e.g. computing power and time) processing numerous HTTP header data blocks achieving little positive compression because of the fact that the character strings may only occur once per web object. As with the registration form example, the present invention solves such problems by pre-loading, via the pre-loaders 104b and 110b, the encoder dictionary 104a and the decoder dictionary 110a based on the expected character strings (e.g., "HTTP Version: 1.0", "HTTP Version: 1.1", "Browser Type: Mozilla", "URL: /www.company.com/intranet/") that are known ahead of time to typically appear in the data 102, but that may only appear once in a given block of the data 102.

Turning again to FIG. 2a, if it is known ahead of time (e.g., by a higher layer application, which is doing the web browsing, etc.) that certain character strings (e.g., "HTTP Version: 1.0", "HTTP Version: 1.1", "Browser Type: Mozilla", "URL: /www.company.com/intranet/", etc.) are expected to be contained in the data 102 as determined by step 202, then such expected character strings can be pre-loaded, via the pre-loaders 104b and 110b, into the encoder dictionary 104a and the decoder dictionary 110a at step 208 as determined by step 204, advantageously, resulting in improved compression ratios. Compression/decompression then can be performed by the encoder 104 and the decoder 110 at step 212 using the dictionaries 104a and 10a pre-loaded at step 206 after initialization of the encoder dictionary 104a and the decoder dictionary 110a at steps 206 or 210.

According to the present invention, the encoder dictionary 104a and the decoder dictionary 110a can be pre-loaded at step 208 with any character strings (e.g., "HTTP Version: 1.0", "HTTP Version: 1.1", "Browser Type: Mozilla", "URL: /www.company.com/intranet/", etc., in the case of the data 102 coming from web browsing using HTTP) that may be expected to appear in the received data 102. The savings in such a scenario can be impressive, ignoring for the moment any unique information filled in for each web page that can be compressed, wherein pre-loading of the encoder dictionary 104a and the decoder dictionary 110a with such expected HTTP character strings at step 208 may result in about 20 to 1 compression efficiency at step 212.

Thus, the encoder dictionary 104a and the decoder dictionary 110a at the other end of the communications channel 108 can be pre-loaded with the same set of expected character strings (e.g., static character strings from a registration form, static HTTP character strings, etc.) at step 208. Accordingly, if the encoder dictionary 104a is pre-loaded with a set of expected character strings via the pre-loader 104b, then the decoder dictionary 110a is pre-loaded via the pre-loader 110b with a same set of expected character strings.

Various methods can be employed by the pre-loaders 104b and 110b for pre-loading the dictionaries 104a and 110a. One method includes sending the set of expected character strings through the encoder 104 and their compressed equivalents through the decoder 110 after an initialization of the dictionaries 104a and 110a. A preferred method, as shown in FIG. 2a, includes a pre-load function via the pre-loaders 104b and 110b at step 208 for both the encoder 104 and the decoder 110 that pre-loads the dictionaries 104a and 110a with the set of expected character strings. Due to the nature of the way character strings are built and extended when processing input data 102, the latter method can create dictionaries 104a and 110a using fewer codeword entries than the former method, thus, resulting in better compression at step 212.

To support the pre-loading of the dictionaries 104a and 110a, the processes performed by the pre-loaders 104b and 110b can be included as part of or separately from the compression/decompression algorithm. Such processes should not affect a basic operation of the compression/decompression algorithm so that the algorithm can support a normal operation (e.g., non-pre-loaded operation) and a pre-loaded operation alternately on a same data flow or simultaneously on different data flows using a separate dictionary. Thus, new processes for dictionary 104a and 110a pre-load can include pre-load of the encoder dictionary 104a, pre-load of the decoder dictionary 110a, re-initialization of the encoder pre-loaded dictionary 104a, re-initialization of the decoder pre-loaded dictionary 110a, etc.

Accordingly, as shown in FIG. 2a, once the dictionaries 104a and 110a are pre-loaded at step 208, via the pre-loader 104b and 110b, the dictionaries 104a and 110a can be initialized at step 210 or re-initialized at step 210 as determined by step 212, while maintaining the pre-loaded strings from step 208 by setting normal operation="No" at step 214. In addition, the dictionaries 104a and 110a can be initialized at step 206 or re-initialized at step 206 for normal operation (e.g., non-pre-loaded operation) as determined by step 212 by setting normal operation="Yes" at step 214.

Figure 2B:
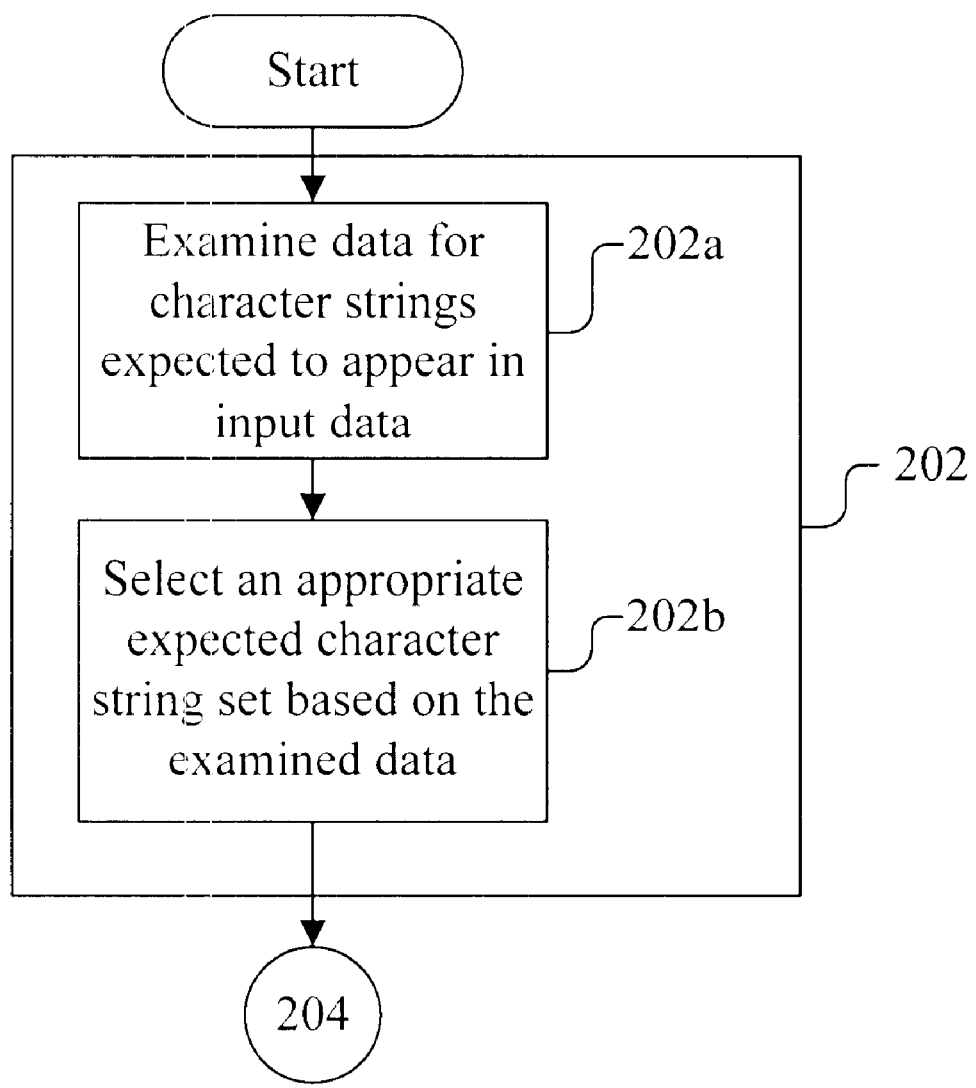

Further, a different set of expected character strings can be pre-loaded at step 208, via the pre-loader 104b and 110b, as determined by step 216 based on the results of the previous iteration of the algorithm. Moreover, step 202 can consist of two sub-steps 202a and 202b, as shown in FIG. 2b, wherein the data 102 can be examined (e.g., by the pre-loaders 104b and 110b or other devices or processes) to determine which set of expected character strings to pre-load. In this aspect of the invention, the data 102 can be examined in step 202a to determine the type of data 102 (e.g., registration form data, HTTP data, etc.) being presented.

For example, the present invention can be employed in conjunction with a communication system which carries TCP/IP packets, wherein the criteria used to determine the type of data can be, for example, a port number being used by a TCP connection. If the TCP port in use is the port associated with HTTP, an expected character string set associated with HTTP can be selected in step 202b and pre-loaded in step 208 by the pre-loaders 104b and 110b.

If the TCP port in use is the port associated with electronic mail, an expected character string set associated with common headers found in electronic mail messages can be selected in step 202b and preloaded in step 208. If the TCP port in use has no re-occurring character string set associated with it, step 204 can direct the algorithm to step 206.

The above examples are exemplary and the present invention is applicable for any character string that can be expected to appear one or more times in the data 102, as will be appreciated by those skilled in the relevant art(s). Similarly, the above-described processes are of an exemplary nature and various other processes can be implemented within the scope of the present invention, as will be appreciated by those skilled in the relevant art(s).

The present invention stores information relating to various processes described herein. This information is stored in one or more memories, such as a hard disk, optical disk, magneto-optical disk, RAM, etc. One or more databases, such as databases within the encoder 104 and the decoder 110 of the system 100, etc., can store the information used to implement the present invention. The databases are organized using data structures (e.g., records, tables, arrays, fields, graphs, trees, and/or lists) contained in one or more memories, such as the memories listed above or any of the storage devices listed below in the discussion of FIG. 3, for example.

The previously described processes include appropriate data structures for storing data collected and/or generated by the processes of the system 100 of FIG. 1 in one or more databases thereof. Such data structures accordingly will includes fields for storing such collected and/or generated data. In a database management system, data is stored in one or more data containers, each container contains records, and the data within each record is organized into one or more fields. In relational database systems, the data containers are referred to as tables, the records are referred to as rows, and the fields are referred to as columns. In object-oriented databases, the data containers are referred to as object classes, the records are referred to as objects, and the fields are referred to as attributes. Other database architectures can use other terminology. Systems that implement the present invention are not limited to any particular type of data container or database architecture. However, for the purpose of explanation, the terminology and examples used herein shall be that typically associated with relational databases. Thus, the terms "table," "row," and "column" shall be used herein to refer respectively to the data container, record, and field.

The present invention (e.g., as described with respect to FIGS. 1 and 2) can be implemented by the preparation of application-specific integrated circuits or by interconnecting an appropriate network of component circuits, as will be appreciated by those skilled in the electrical art(s). In addition, all or a portion of the invention (e.g., as described with respect to FIGS. 1 and 2) can be conveniently implemented using one or more general purpose computers, microprocessors, digital signal processors, microcontrollers, etc., programmed according to the teachings of the present invention (e.g., using the computer system of FIG. 3), as will be appreciated by those skilled in the computer and software art(s). Appropriate software can be readily prepared by programmers of ordinary skill based on the teachings of the present disclosure, as will be appreciated by those skilled in the software art. Further, the present invention can be implemented on the World Wide Web (e.g., using the computer system of FIG. 3).

Figure 3:
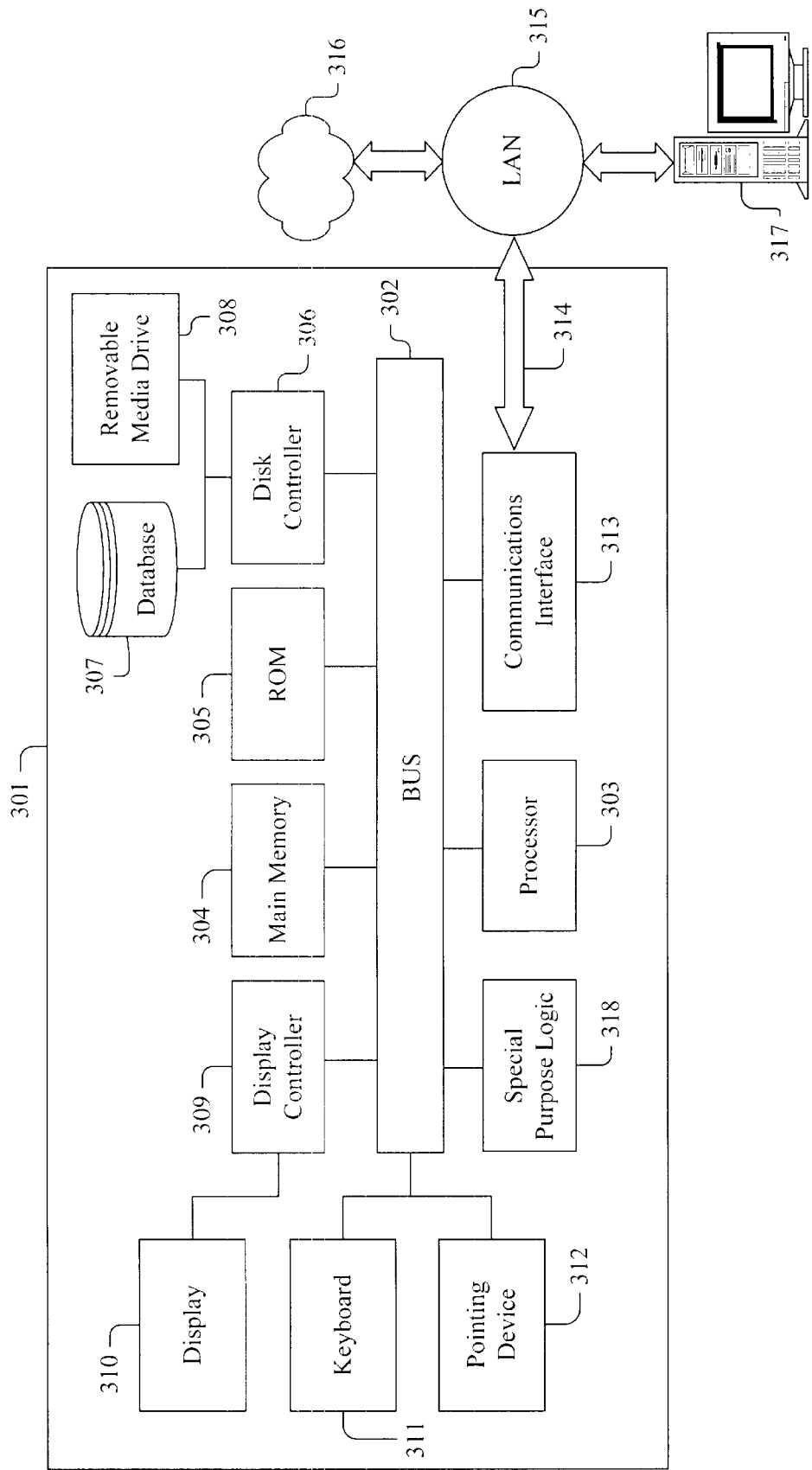
FIG. 3 is an exemplary computer system, which can be programmed to perform one or more of the processes of the present invention.

FIG. 3 illustrates a computer system 301 upon which the present invention (e.g., the encoder 104, the decoder 110, the system 100, etc.) can be implemented. The present invention can be implemented on a single such computer system, or a collection of multiple such computer systems. The computer system 301 includes a bus 302 or other communication mechanism for communicating information, and a processor 303 coupled to the bus 302 for processing the information. The computer system 301 also includes a main memory 304, such as a random access memory (RAM), other dynamic storage device (e.g., dynamic RAM (DRAM), static RAM (SRAM), synchronous DRAM (SDRAM)), etc., coupled to the bus 302 for storing information and instructions to be executed by the processor 303. In addition, the main memory 304 can also be used for storing temporary variables or other intermediate information during the execution of instructions by the processor 303. The computer system 301 further includes a read only memory (ROM) 305 or other static storage device (e.g., programmable ROM (PROM), erasable PROM (EPROM), electrically erasable PROM (EEPROM), etc.) coupled to the bus 302 for storing static information and instructions.

The computer system 301 also includes a disk controller 306 coupled to the bus 302 to control one or more storage devices for storing information and instructions, such as a magnetic hard disk 307, and a removable media drive 308 (e.g., floppy disk drive, read-only compact disc drive, read/write compact disc drive, compact disc jukebox, tape drive, and removable magneto-optical drive). The storage devices can be added to the computer system 301 using an appropriate device interface (e.g., small computer system interface (SCSI), integrated device electronics (IDE), enhanced-IDE (E-IDE), direct memory access (DMA), or ultra-DMA).

The computer system 301 can also include special purpose logic devices 318, such as application specific integrated circuits (ASICs), full custom chips, configurable logic devices (e.g., simple programmable logic devices (SPLDs), complex programmable logic devices (CPLDs), field programmable gate arrays (FPGAs), etc.), etc., for performing special processing functions, such as signal processing, image processing, speech processing, voice recognition, infrared (IR) data communications, satellite communications transceiver functions, encoder 104 functions, decoder 110 functions, etc.

The computer system 301 can also include a display controller 309 coupled to the bus 302 to control a display 310, such as a cathode ray tube (CRT), liquid crystal display (LCD), active matrix display, plasma display, touch display, etc., for displaying or conveying information to a computer user. The computer system includes input devices, such as a keyboard 311 including alphanumeric and other keys and a pointing device 312, for interacting with a computer user and providing information to the processor 303. The pointing device 312, for example, can be a mouse, a trackball, a pointing stick, etc., or voice recognition processor, etc., for communicating direction information and command selections to the processor 303 and for controlling cursor movement on the display 310. In addition, a printer can provide printed listings of the data structures/information of the system shown in FIG. 1, or any other data stored and/or generated by the computer system 301.

The computer system 301 performs a portion or all of the processing steps of the invention in response to the processor 303 executing one or more sequences of one or more instructions contained in a memory, such as the main memory 304. Such instructions can be an read into the main memory 304 from another computer readable medium, such as a hard disk 307 or a removable media drive 308. Execution of the arrangement of instructions contained in the main memory 304 causes the processor 303 to perform the process steps described herein. One or more processors in a multi-processing arrangement can also be employed to execute the sequences of instructions contained in main memory 304. In alternative embodiments, hard-wired circuitry can be used in place of or in combination with software instructions. Thus, embodiments are not limited to any specific combination of hardware circuitry and software.

Stored on any one or on a combination of computer readable media, the present invention includes software for controlling the computer system 301, for driving a device or devices for implementing the invention, and for enabling the computer system 301 to interact with a human user (e.g., users of the system 100 of FIG. 1, etc.). Such software can include, but is not limited to, device drivers, operating systems, development tools, and applications software. Such computer readable media further includes the computer program product of the present invention for performing all or a portion (if processing is distributed) of the processing performed in implementing the invention. Computer code devices of the present invention can be any interpretable or executable code mechanism, including but not limited to scripts, interpretable programs, dynamic link libraries (DLLs), Java classes and applets, complete executable programs, Common Object Request Broker Architecture (CORBA) objects, etc. Moreover, parts of the processing of the present invention can be distributed for better performance, reliability, and/or cost.

The computer system 301 also includes a communication interface 313 coupled to the bus 302. The communication interface 313 provides a two-way data communication coupling to a network link 314 that is connected to, for example, a local area network (LAN) 315, or to another communications network 316 such as the Internet. For example, the communication interface 313 can be a digital subscriber line (DSL) card or modem, an integrated services digital network (ISDN) card, a cable modem, a telephone modem, etc., to provide a data communication connection to a corresponding type of telephone line. As another example, communication interface 313 can be a local area network (LAN) card (e.g., for Ethernet™, an Asynchronous Transfer Model (ATM) network, etc.), etc., to provide a data communication connection to a compatible LAN. Wireless links can also be implemented. In any such implementation, communication interface 313 sends and receives electrical, electromagnetic, or optical signals that carry digital data streams representing various types of information. Further, the communication interface 313 can include peripheral interface devices, such as a Universal Serial Bus (USB) interface, a PCMCIA (Personal Computer Memory Card International Association) interface, etc.

The network link 314 typically provides data communication through one or more networks to other data devices. For example, the network link 314 can provide a connection through local area network (LAN) 315 to a host computer 317, which has connectivity to a network 316 (e.g. a wide area network (WAN) or the global packet data communication network now commonly referred to as the "Internet") or to data equipment operated by service provider. The local network 315 and network 316 both use electrical, electromagnetic, or optical signals to convey information and instructions. The signals through the various networks and the signals on network link 314 and through communication interface 313, which communicate digital data with computer system 301, are exemplary forms of carrier waves bearing the information and instructions.

The computer system 301 can send messages and receive data, including program code, through the network(s), network link 314, and communication interface 313. In the Internet example, a server (not shown) might transmit requested code belonging to an application program for implementing an embodiment of the present invention through the network 316, LAN 315 and communication interface 313. The processor 303 can execute the transmitted code while being received and/or store the code in storage devices 307 or 308, or other non-volatile storage for later execution. In this manner, computer system 301 can obtain application code in the form of a carrier wave. With the system of FIG. 3, the present invention can be implemented on the Internet as a Web Server 301 performing one or more of the processes according to the present invention for one or more computers coupled to the Web server 301 through the network 316 coupled to the network link 314.

The term "computer readable medium" as used herein refers to any medium that participates in providing instructions to the processor 303 for execution. Such a medium can take many forms, including but not limited to, non-volatile media, volatile media, transmission media, etc. Non-volatile media include, for example, optical or magnetic disks, magneto-optical disks, etc., such as the hard disk 307 or the removable media drive 308. Volatile media include dynamic memory, etc., such as the main memory 304. Transmission media include coaxial cables, copper wire, fiber optics, including the wires that make up the bus 302. Transmission media can also take the form of acoustic, optical, or electromagnetic waves, such as those generated during radio frequency (RF) and infrared (IR) data communications. As stated above, the computer system 301 includes at least one computer readable medium or memory for holding instructions programmed according to the teachings of the invention and for containing data structures, tables, records, or other data described herein. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media can be involved in providing instructions to a processor for execution. For example, the instructions for carrying out at least part of the present invention can initially be borne on a magnetic disk of a remote computer connected to either of networks 315 and 316. In such a scenario, the remote computer loads the instructions into main memory and sends the instructions, for example, over a telephone line using a modem. A modem of a local computer system receives the data on the telephone line and uses an infrared transmitter to convert the data to an infrared signal and transmit the infrared signal to a portable computing device, such as a personal digital assistant (PDA), a laptop, an Internet appliance, etc. An infrared detector on the portable computing device receives the information and instructions borne by the infrared signal and places the data on a bus. The bus conveys the data to main memory, from which a processor retrieves and executes the instructions. The instructions received by main memory can optionally be stored on storage device either before or after execution by processor.

Although the present invention is described in terms of the encoder 104 and the decoder 110 employed in communications channel 108 (e.g., the Internet, an Intranet, a wireless communications channel, a satellite communications channel, a cellular communications channel, etc.), the present invention is applicable to other communications channels and systems that can employ data compression and/or decompression, such as Virtual Private Networks (VPNs) employing IPComp, etc., as will be appreciated by those skilled in the relevant art(s).

While the present invention has been described in connection with a number of embodiments and implementations, the present invention is not so limited but rather covers various modifications and equivalent arrangements, which fall within the purview of the appended claims.

What is claimed is:

1. A method for encoding data transmitted over a communications channel, comprising:
   pre-loading an encoder dictionary with a set of character strings expected to appear in input data to be encoded;
   encoding the input data with the set of expected character strings pus-loaded in the encoder dictionary; and
   determining the set of expected character strings from a plurality of sets of expected character strings corresponding to a plurality of types of input data to be encoded.

2. A method for encoding data transmitted over a communications channel, comprising:
   pre-loading an encoder dictionary with a set of character strings expected to appear in input data to be encoded;
   encoding the input data with the set of expected character strings pre-loaded in the encoder dictionary;
   categorizing the type of input data to be encoded;
   determining the set of expected character strings based on the categorizing step;
   performing the categorizing and determining steps separately from an encoding algorithm.

3. The method of claim 2 wherein the performing step performs the categorizing and determining steps as part of an encoding algorithm.

4. A method for encoding data transmitted over a communications channel, comprising:
   pre-loading an encoder dictionary with a set of character strings expected to appear in input data to be encoded;
   encoding the input data with the set of expected character strings pre-loaded in the encoder dictionary; and
   transmitting the encoded data over the communications channel.

5. The method of claim 4 further comprising encoding the input data based on a Lempel-Ziv-Jeff-Heath (LZJH) data compression algorithm.

6. A method for encoding data transmitted over a communications channel, comprising:
   pre-loading an encoder dictionary with a set of character strings expected to appear in input data to be encoded by sending the set of expected character strings through the encoder after initializing the encoder dictionary; and
   encoding the input data with the set of expected character strings pre-loaded in the encoder dictionary.

7. A method for encoding data transmitted over a communications channel, comprising:
   pro-loading an encoder dictionary with a set of character strings expected to appear in input data to be encoded via a pro-load function that pro-loads the encoder dictionary with the set of expected character strings; and
   encoding the input data with the set of expected character strings pre-loaded in the encoder dictionary.

8. An apparatus for encoding data transmitted over a communications channel, comprising:
   an encoder;
   an encoder dictionary pre-loaded with a set of character strings expected to appear in input data to be encoded, wherein the encoder is configured to encode the input data with the set of expected character strings pre-loaded in the encoder dictionary; and
   means for determining the set of expected character strings from a plurality of sets of expected character strings corresponding to a plurality of types of input data to be encoded.

9. An apparatus for encoding data transmitted over a communications channel, comprising:
   an encoder;
   an encoder dictionary pre-loaded with a set of character strings expected to appear in input data to be encoded;
   means for categorizing the type of input data to be encoded;
   means for determining the set of expected character strings based on the categorizing step; and
   wherein the encoder is configured to encode the input data with the set of expected character strings pre-loaded in the encoder dictionary; and
   wherein the categorizing and determining means are separate from the encoder.

10. The apparatus of claim 9, wherein the categorizing and determining means are part of the encoder.

11. An apparatus for encoding data transmitted over a communications channel, comprising:
    an encoder; and
    an encoder dictionary ore-loaded with a set of character strings expected to appear in input data to be encoded; and
    wherein the encoder is configured to encode the input data with the set of expected character strings pre-loaded in the encoder dictionary; and
    wherein the encoded data is transmitted over the communications channel.

12. The apparatus of claim 11, wherein the encoder encodes the input data based on a Lempel-Ziv-Jeff-Heath (LZJH) data compression algorithm.

13. An apparatus for encoding data transmitted over a communications channel, comprising:
    an encoder; and
    an encoder dictionary pre-loaded with a set of character strings expected to appear in input data to be encoded by sending the set of expected character strings through the encoder after initializing the encoder dictionary,
    wherein the encoder is configured to encode the input data with the set of expected character strings pre-loaded in the encoder dictionary.

14. An apparatus for encoding data transmitted over a communications channel, comprising:
    an encoder; and
    an encoder dictionary pre-loaded with a set of character strings expected to appear in input data to be encoded via a pre-load function,
    wherein the encoder is configured to encode the input data with the set of expected character strings pre-loaded in the encoder dictionary.

15. An apparatus for encoding data transmitted over a communications channel, comprising:
    an encoder; and
    an encoder dictionary pro-loaded with a set of character strings expected to appear in input data to be encoded; and
    a determining means configured to determine the set of expected character strings from a plurality of sets of expected character strings corresponding to a plurality of types of input data to be encoded; and
    wherein the encoder is configured to encode the input data with the set of expected character strings pre-loaded in the encoder dictionary.

16. A computer-readable medium carrying one or more sequences of one or more instructions for encoding data transmitted over a communications channel, the one or more sequences of one or more instructions including instructions which, when executed by one or more processors, cause the one or more processors to perform the steps of:
    pre-loading an encoder dictionary with a set of character strings expected to appear in input data to be encoded;
    encoding the input data with the set of expected character strings pre-loaded in the encoder dictionary; and
    determining the set of expected character strings from a plurality of sets of expected character strings corresponding to a plurality of types of input data to be encoded.

17. A method for decoding encoded data received over a communications channel, comprising:
    pre-loading a decoder dictionary with a set of character strings expected to appear in the encoded data;
    decoding the encoded data with the set of expected character strings pre-loaded in the decoder dictionary; and
    determining the set of expected character strings implicitly by using a same set of character strings pre-loaded into a peer encoder dictionary.

18. A method for decoding encoded data received over a communications channel, comprising:
    pre-loading a decoder dictionary with a set of character strings expected to appear in the encoded data;
    decoding the encoded data with the set of expected character strings pro-loaded in the decoder dictionary; and
    determining the set of expected character strings from a plurality of sets of expected character strings corresponding to a plurality of types of the encoded data.

19. A method for decoding encoded data received over a communications channel, comprising:
    pre-loading a decoder dictionary with a set of character strings expected to appear in the encoded data;
    decoding the encoded data with the set of expected character strings pre-loaded in the decoder dictionary;
    categorizing the type of the encoded data;
    determining the set of expected character strings based on the categorizing step; and
    performing the categorizing and determining steps separately from a decoding algorithm.

20. The method of claim 19 wherein the performing step performs the categorizing and determining steps as part of a decoding algorithm.

21. A method for decoding encoded data received over a communications channel, comprising:
    pre-loading a decoder dictionary with a set of character strings expected to appear in the encoded data;
    decoding the encoded data with the set of expected character strings pre-loaded in the decoder dictionary; and
    receiving the encoded data over the communications channel.

22. The method of claim 21, further comprising decoding the input data based on a Lempel-Ziv-Jeff-Heath (LZJH) data decompression algorithm.

23. A method for decoding encoded data received over a communications channel, comprising:
    pre-loading a decoder dictionary with a set of character strings expected to appear in the encoded data by sending an encoded version of the set of expected character strings through a decoder after initializing the decoder dictionary; and decoding the encoded data with the set of expected character strings pre-loaded in the decoder dictionary.

24. A method for decoding encoded data received over a communications channel, comprising:

pre-loading a decoder dictionary with a set of character strings expected to appear in the encoded data via a pre-load function; and decoding the encoded data with the set of expected character strings pre-loaded in the decoder dictionary.

25. A method for decoding encoded data received over a communications channel, comprising:

pre-loading a decoder dictionary with a set of character strings expected to appear in the encoded data, wherein an encoder dictionary is pre-loaded with the set of expected character strings; and decoding the encoded data with the set of expected character strings pre-loaded in the decoder dictionary.

26. An apparatus for decoding encoded data received over a communications channel, comprising:

a decoder dictionary pre-loaded with a set of character strings expected to appear in the encoded data; and a decoder configured to decode the encoded data with the set of expected character strings pre-loaded in the decoder dictionary; and means for determining the set of expected character strings implicitly by using a same set of character strings pre-loaded into a peer encoder dictionary.

27. An apparatus for decoding encoded data received over a communications channel, comprising:

a decoder dictionary pre-loaded with a set of character strings expected to appear in the encoded data;

a decoder configured to decode the encoded data with the set of expected character strings pre-loaded in the decoder dictionary; and the set of expected character strings from a plurality of sets of expected character strings corresponding to a plurality of types of the encoded data.

28. An apparatus for decoding encoded data received over a communications channel, comprising:

a decoder dictionary pre-loaded with a set of character strings expected to appear in the encoded data; and a decoder configured to decode the encoded data with the set of expected character strings ore-loaded In the decoder dictionary;

means for categorizing the type of the encoded data; and means for determining the set of expected character strings based on the categorizing step; and wherein the categorizing and determining means are separate from the decoder.

29. An apparatus for decoding encoded data received over a communications channel, comprising:

a decoder dictionary ore-loaded with a set of character strings expected to appear in the encoded data; and a decoder configured to decode the encoded data with the set of expected character strings ore-loaded in the decoder dictionary;

means for categorizing the type of the encoded data; and means for determining the set of expected character strings based on the categorizing step; and wherein the categorizing and determining means are part of the decoder.

30. An apparatus for decoding encoded data received over a communications channel comprising:

a decoder dictionary pre-loaded with a set of character strings expected to appear in the encoded data; and a decoder configured to decode the encoded data with the set of expected character strings pre-loaded in the decoder dictionary; and wherein the encoded data is received over the communications channel.

31. The apparatus of claim 30, wherein the decoder is configured to decode the input data based on a Lempel-Ziv-Jeff-Heath (LZJH) data decompression algorithm.

32. An apparatus for decoding encoded data received over a communications channel, comprising:

a decoder dictionary pre-loaded with a set of character strings expected to appear in the encoded data; and a decoder configured to decode the encoded data with the set of expected character strings pre-loaded in the decoder dictionary, wherein the decoder dictionary is pro-loaded by sending an encoded version of the set of expected character strings through the decoder after initializing the decoder dictionary.

33. An apparatus for decoding encoded data received over a communications channel, comprising:

a decoder dictionary pre-loaded with a set of character strings expected to appear in the encoded data via a pre-load function; and a decoder configured to decode the encoded data with the set of expected character strings pre-loaded in the decoder dictionary.

34. An apparatus for decoding encoded data received over a communications channel, comprising:

a decoder dictionary pre-loaded with a set of character strings expected to appear in the encoded data; and a decoder configured to decode the encoded data with the set of expected character strings pre-loaded in the decoder dictionary, wherein an encoder dictionary is pre-loaded with the set of expected character strings.

* * * * *